United States Patent [19]
Martin et al.

[11] Patent Number: 5,424,996
[45] Date of Patent: Jun. 13, 1995

[54] DUAL TRANSPARENT LATCH

[75] Inventors: Robert J. Martin, Timnath; Glenn T. Colon-Bonet; Brian C. Miller, both of Ft. Collins, all of Colo.

[73] Assignee: Hewlett-Packard Company, Palo Alto, Calif.

[21] Appl. No.: 953,158

[22] Filed: Sep. 29, 1992

[51] Int. Cl.[6] ............................ G11C 8/00; G11C 7/00
[52] U.S. Cl. ............................... 365/233; 365/189.01; 365/189.05
[58] Field of Search ............... 365/233, 189.05, 78, 365/154, 189.01, 230.05, 230.08, 220

[56] References Cited

U.S. PATENT DOCUMENTS

| | | | |
|---|---|---|---|
| 3,896,417 | 7/1975 | Beecham | 365/78 |
| 4,628,489 | 12/1986 | Ong et al. | 365/233 |
| 4,849,935 | 7/1989 | Miyazawa | 365/189.05 |
| 5,003,513 | 3/1991 | Porter et al. | 365/189.05 |
| 5,023,835 | 6/1991 | Akimoto et al. | 365/189.05 |
| 5,265,049 | 11/1993 | Takasugi | 365/233 |

FOREIGN PATENT DOCUMENTS 8300769  3/1985  WIPO .................... 365/233

*Primary Examiner*—Eugene R. LaRoche
*Assistant Examiner*—Tan Nguyen

[57] ABSTRACT

A dual transparent latch circuit is disclosed comprising two latches cross coupled together by two control lines to enable the latches collectively to input and output data at twice the frequency of the master clock frequency which controls the timing of each latch individually. The control lines are controlled by a clock generator such that one latch is enabled to receive and store data while the other latch is enabled to output data stored therein. At the same time, the latch receiving and storing the data is disabled from providing an output of the stored data and the latch providing the output is disabled from receiving and storing the data. The clock generator switches the states of the control lines such that they enable or disable the input of data to and output of data from the latches on each phase of the master clock signal. A dual transparent latch with triple edge timing is also disclosed. A method for generating a master signal having a master frequency and selectively enabling inputs at an input data rate greater than the master frequency to input data into memory and selectively enabling outputs at the input data rate to output data from memory.

26 Claims, 14 Drawing Sheets

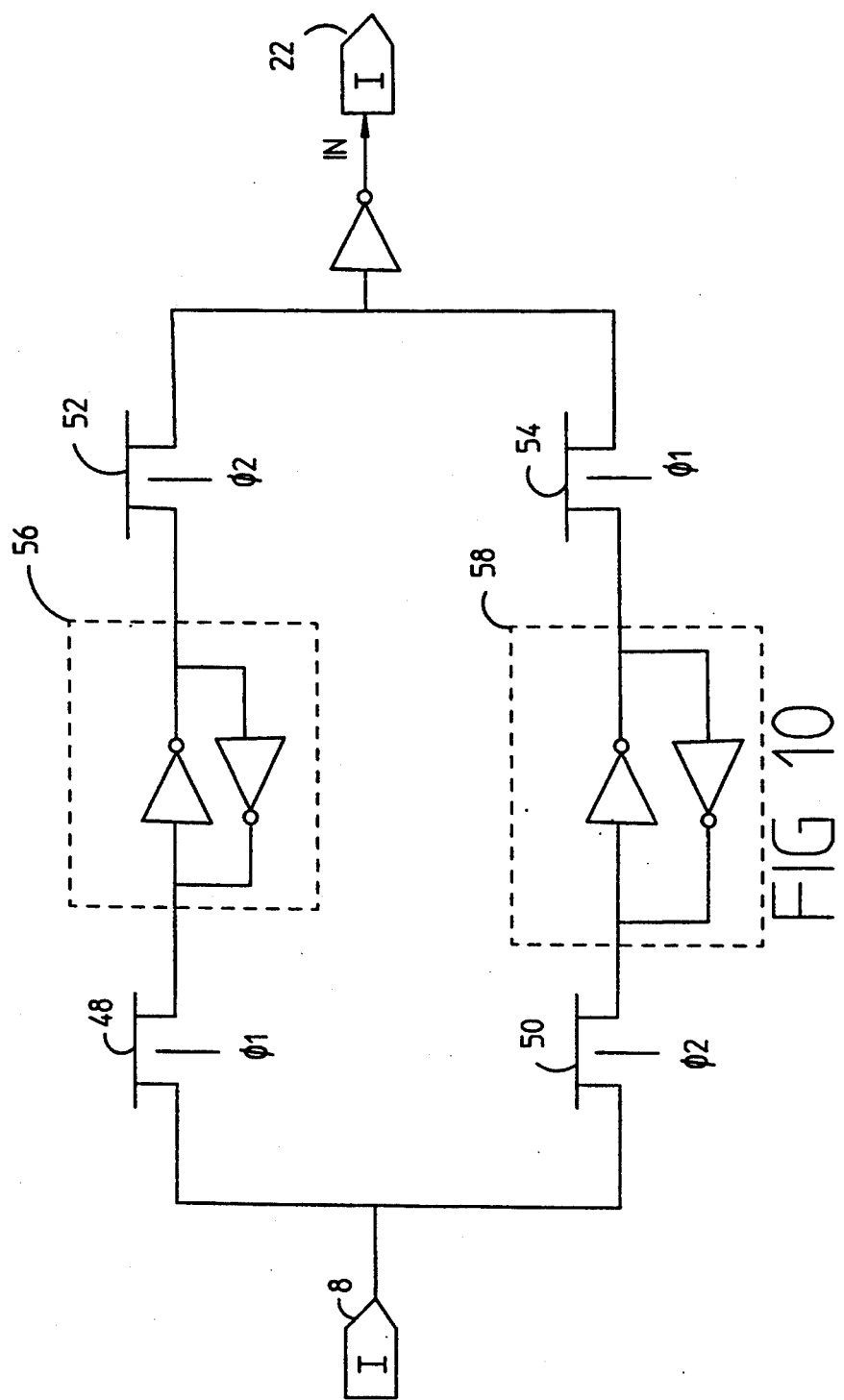

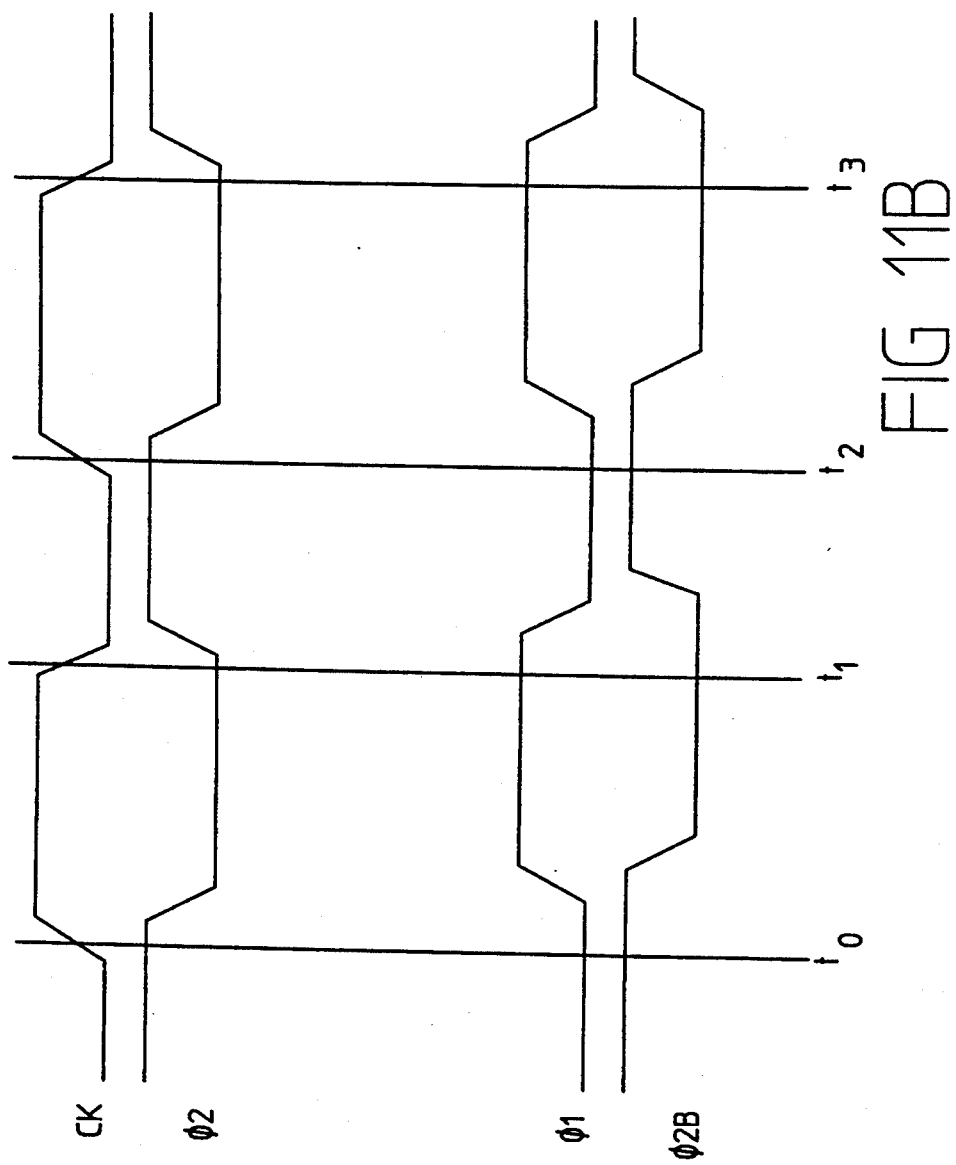

DUAL TRANSPARENT LATCH

FIELD OF INVENTION

The present invention relates generally to latching circuits. More particularly, the invention relates to latching circuits which operate at higher frequencies than the frequency of a master clock which controls the timing of each latching element within the circuit.

BACKGROUND

Digital logic is extensively used in data and signal processing systems. Typically, the timing of these systems is controlled by a master clock. Specifically, one master clock provides a timing signal having a master frequency to each of the system's elements. Clock dividers are often used to divide the master frequency resulting in clock signals having lower frequencies than the master frequency. Thus the master frequency is generally selected to be the highest frequency required by any of the elements of the system.

However, the master frequency also limits the speed at which the system can operate. For instance, in many applications such as running iterative loops, the master frequency unnecessarily limits the speed at which the loop operates. For example, refer to the iterative loop shown in FIG. 1. Two data paths are provided as inputs to the loop and are designated DATAIN1 and DATAIN2. Specifically, DATAIN1 and DATAIN2 are inputs to data operation blocks 5 and 6 respectively. A data operation block may be, for instance, an incrementor, adder, subtractor, multiplier, etc., which are well known in the art. These data operations are typically performed by combinational circuits of logic gates. Therefore, they respond almost immediately to any changes in the contents of their respective inputs, DATAIN1 and DATAIN2. However, register 4 which completes the iterative loop and has an input coupled to the output of data operation block 6, ignores any change at its input until it receives a clock pulse from the master clock 3. Register 4 inputs new data from data operation block 6 and outputs any data stored therein upon either the leading edge or the trailing edge of each clock pulse. Thus, the data operation block 5 which has an input coupled to the output of register 4 does not receive a new input until a clock pulse is received by register 4. Therefore, the master clock frequency limits the rate at which data can be output from the loop as well.

To solve this problem, a higher frequency waveform must be provided to register 4 to speed up the operation. For example, a second master clock can be provided to generate an additional timing signal with the same master frequency. If the second clock operates at 90° out-of-phase with the master clock, then the frequency of the combined clock pulses received by register 4 is doubled. The iterative loop circuit can, therefore, run at twice the speed using timing signals from both clocks rather than using only the one master clock. However adding an additional clock is costly and complicated to integrate the additional timing signal into the existing circuit.

Alternatively, a higher frequency master clock could be used so that iterative loops and similar applications would not be limited by a slower clock. However, a higher frequency master clock is often more expensive than a lower frequency clock. Furthermore, it will become necessary to provide clock divide circuits to generate lower frequencies required by other system applications that would not otherwise have been necessary if the master clock with a lower master frequency was selected.

Since the addition of duplicate or substitute hardware is costly and complex to integrate into the system, there is a need to provide a simple clocking scheme which does not require a higher frequency waveform than the master clock frequency. The present invention fulfills this need.

SUMMARY OF THE INVENTION

According to the present invention, there is provided a circuit comprising a memory means having at least two inputs and at least two corresponding outputs and a control means for selectively enabling the inputs and outputs of the memory means at a higher frequency than a master frequency of a master clock which controls the timing of the circuit. The higher frequency is preferably about twice the master frequency.

In a preferred embodiment, the memory means comprises two transparent latches each having an output coupled to a tri-state driver or an equivalent thereof such that a first latch is coupled to a first driver and a second latch is coupled to a second driver. In this preferred embodiment, the control means comprises control lines for enabling the inputs of the latches and the drivers, and a clock generator. Each latch and driver pair are cross coupled by the control lines so that one control line is coupled to the first latch and second driver and the other control line is coupled to the second latch and the first driver. The control lines have alternating high and low states which are controlled by the clock generator. The clock generator is driven by the master clock to switch the states of the control lines on each phase of the master clock signal. When one control line is in a substantially low state, the other control line will be controlled so that it is in a substantially high state. In this way, one latch will be enabled to input data and the driver coupled to that latch will be disabled thereby causing the data to be stored in the latch. At substantially the same time, the other latch will be disabled and the driver coupled to the disabled latch will be enabled to output the data stored within that latch.

Two preferred embodiments of the clock generator are provided. One clock generator minimizes the circuit complexity and is preferably used in long hold time applications. The second clock generator prohibits either control line from transitioning to a high state, i.e. enabling the driver coupled to one latch to output stored data, until after the other control line has transitioned and has substantially reached a low state. This second embodiment is preferably used in short hold time applications to prevent overwriting or losing data which may otherwise occur in short hold time applications.

In a second preferred embodiment, the inputs and the corresponding outputs of the memory means are switches. The control means in this embodiment provides at least two timing signals. One timing signal turns on a first input switch and an output switch corresponding to a second input switch during one phase of the master clock signal. A different timing signal turns on the second input switch and the output switch corresponding to the first input switch during the other phase of the master clock signal.

To avoid overwriting or losing data in a short hold time application, the control means may comprise a clock tree having at least three inverters. An input of the first inverter receives the master clock signal and an output thereof provides a timing signal for turning on the second input switch. The second inverter receives the timing signal from the first inverter as an input and provides another timing signal for turning on the first input switch and the second output switch. That timing signal is also received as an input to the third inverter. The third inverter provides a third timing signal for turning on the output switch corresponding to the first switch. The state transitions of each timing signal are delayed with respect to each other by each successive inverter. In this way, the timing signal turning on an output switch will not transition to a substantially high state until the timing signal turning on its corresponding input switch has transitioned to a substantially low state.

A method comprising the steps of generating a master clock signal having a master frequency, selectively enabling the input of first and second data inputs into memory at an input data rate greater than the master frequency, and selectively enabling the output of first and second data outputs from memory at a rate substantially the same as the input data rate is also provided. The inputs and outputs are preferably enabled so that only one of the inputs and one of the outputs are enabled at any one instant of time. The input data rate is also preferably twice the master frequency.

BRIEF DESCRIPTION OF THE DRAWINGS

The present invention will be better understood, and its numerous objects and advantages will become apparent by reference to the following detailed description of the invention when taken in conjunction with the following drawings:

FIG. 10 is an alternative circuit diagram of a dual transparent latch according to the present invention.

FIG. 11B is a timing diagram showing the timing of each timing signal generated by the circuit of FIG. 11A.

DETAILED DESCRIPTION OF THE INVENTION

Figure 1:
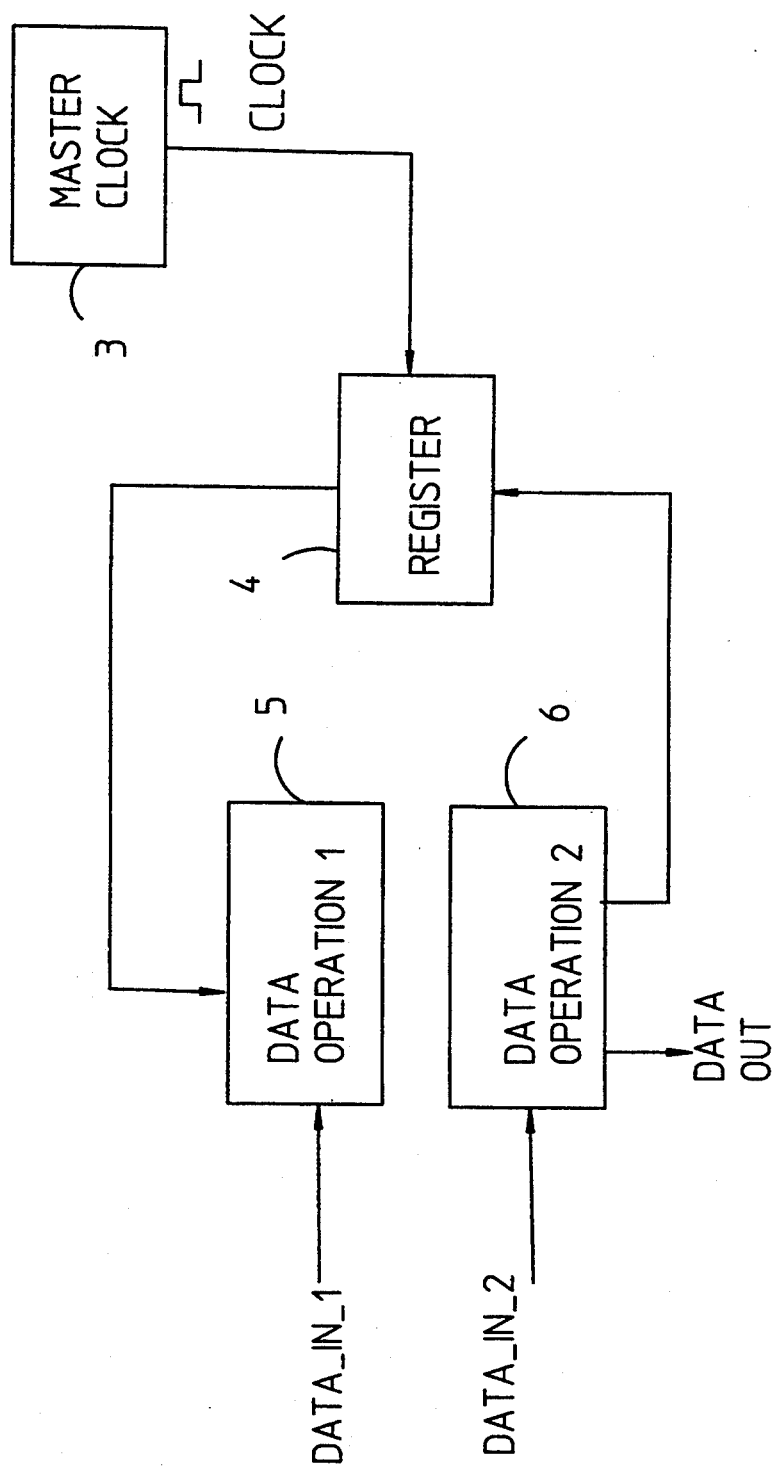
FIG. 1 is a block diagram showing an example of a prior art iterative loop limited by the master clock frequency.
Figure 2:
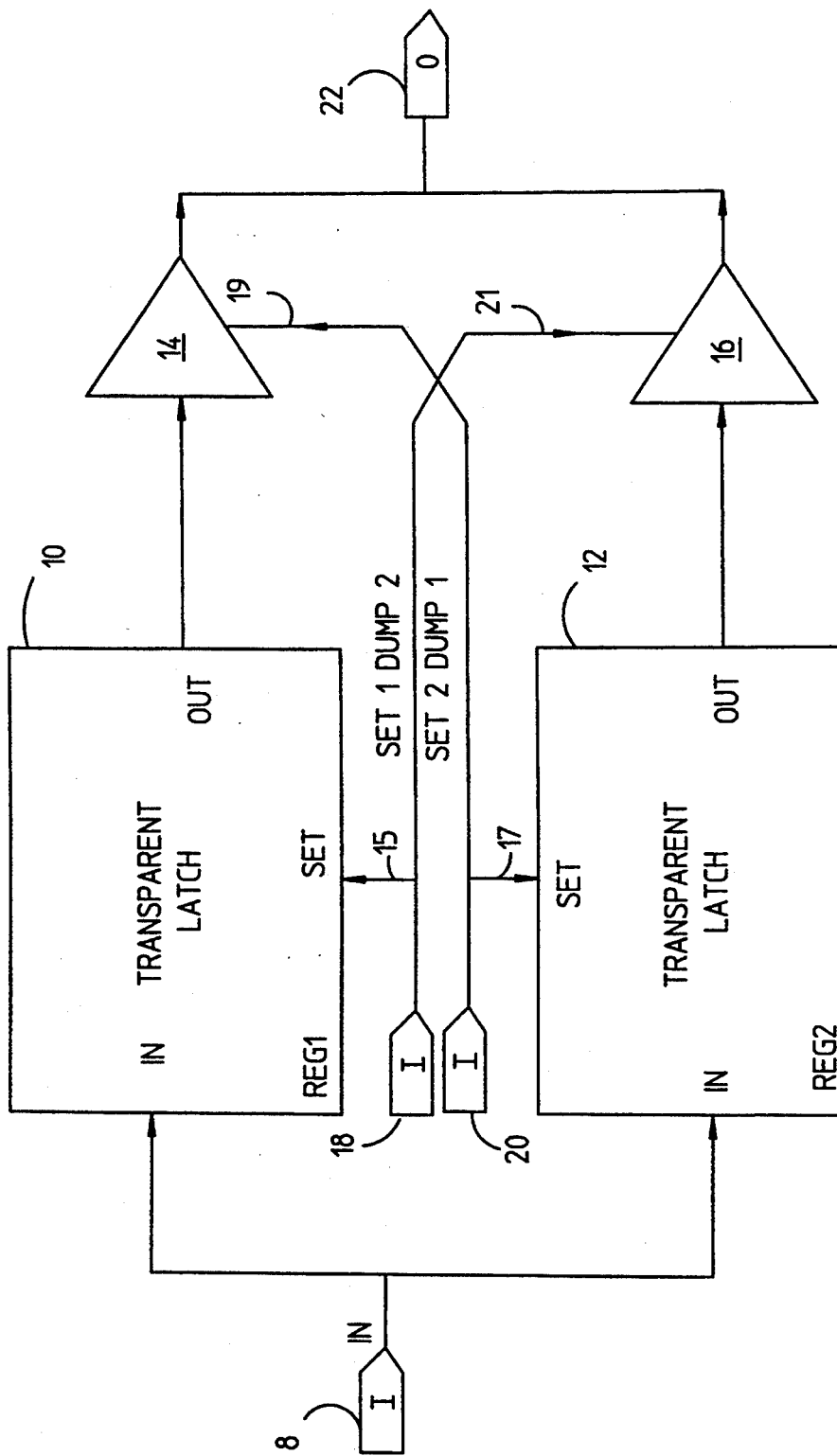
FIG. 2 is a circuit diagram of a dual transparent latch according to the present invention.

A block diagram of an embodiment of the present invention is shown in FIG. 2. Like reference numerals refer to like elements in the figures. In particular, the embodiment shown in FIG. 2 is a dual transparent latch which doubles the operational speed of a circuit it is included in by clocking data in and out on each phase of the master clock signal. For instance, if the dual transparent latch of FIG. 2 replaced register 4 in the iterative loop shown in FIG. 1, the loop could operate at twice the frequency of the master clock.

The circuit of FIG. 2 is shown as having two latches 10 and 12 for exemplary purposes only, and it should be understood that the invention is in no way limited thereto. For example, a network of D-type registers, memory buffers having at least two inputs and corresponding outputs and equivalents thereof, could be used instead of the dual latch configuration.

Input data is provided to the dual latch circuit at the input terminal 8 at twice the master clock frequency. Two transparent latches 10 and 12 are coupled together at the input terminal 8. Latch 10 has an output coupled to a tristate driver 14 and latch 12 has an output coupled to tristate driver 16. The outputs of the drivers 14 and 16 are also coupled together to form the output terminal 22 of the circuit. The set control lines 18 and 20, referred to as Set1Dump2 and Set2Dump1 respectively, are cross coupled such that Set1Dump2 interfaces with latch 10 via interface 15 and driver 16 via interface 21 and Set2Dump1 interfaces with latch 12 via interface 17 and driver 14 via interface 19. The set control lines 18 and 20 enable the respective latches to latch and hold the input data provided to the input terminal 8. The control lines 18 and 20 also enable the respective drivers to pass the input data stored in the respective latch to the output terminal 22. When one of the control lines 18 or 20 is high the other control line will be low so that data is latched into the circuit and out of the circuit at twice the master frequency.

Figure 3:
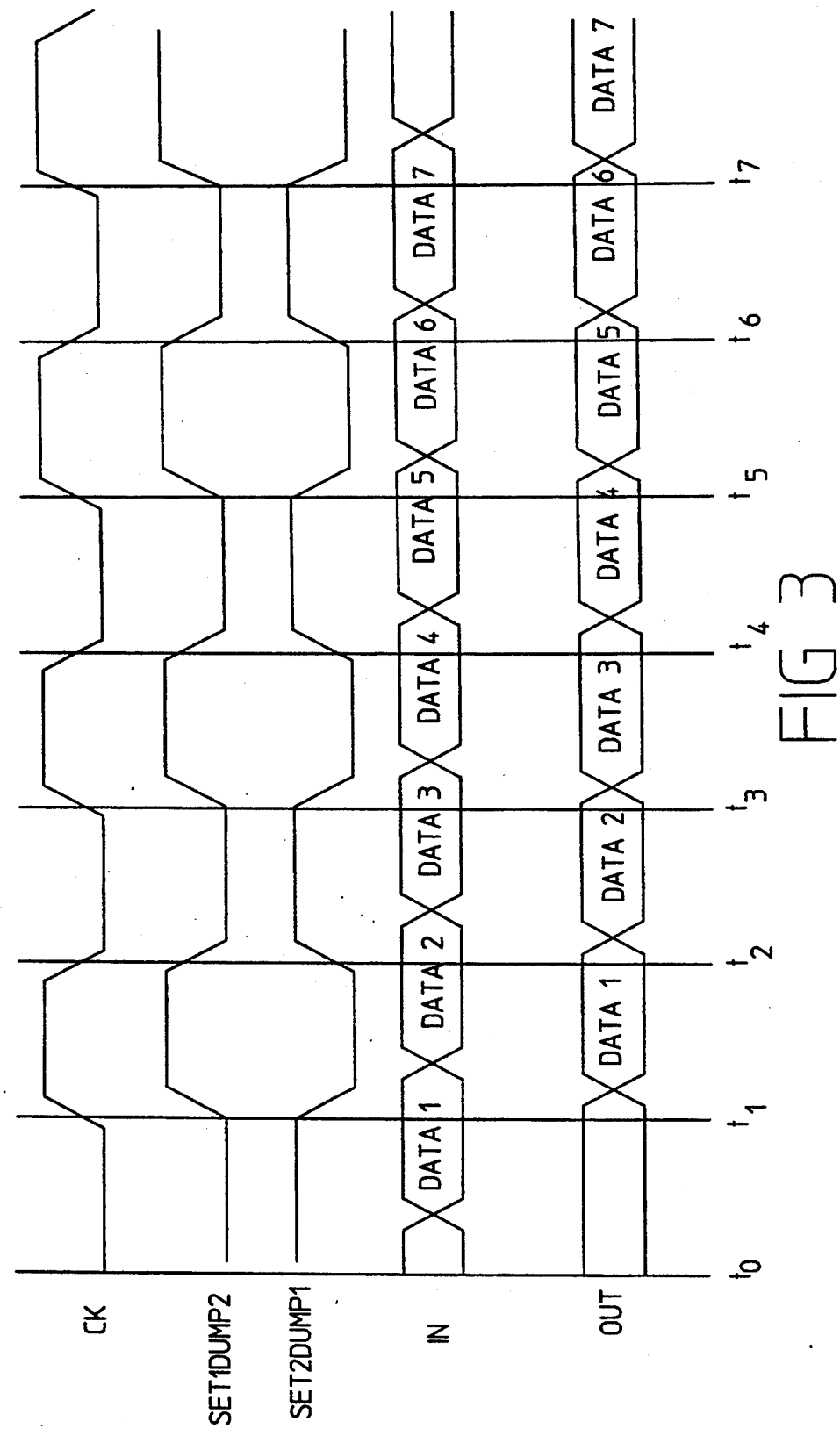
FIG. 3 is a timing diagram showing the timing for long hold time applications of the dual transparent latch shown in FIG. 2.

The operation of the circuit can be better understood by reference to the timing diagram shown in FIG. 3. The input data arrives at the input terminal 8 and is latched into one of the latches 10 or 12 depending upon which latch is enabled. When Set2Dump1 transitions from a high state to a low state, the input data is latched into latch 12. Alternatively, when Set1Dump2 transitions from a high state to a low state, the input data is latched into latch 10. Therefore, DATA1 is latched into latch 12 during the time period $t_1-t_2$ when the Set2Dump1 control line transitions from high to low. During the time period $t_1-t_2$, DATA1 is output from latch 12 when Set1Dump2 goes high and no other input data can be latched into latch 12 while the Set2Dump1 control line remains low. Latch 10, however, latches in DATA2 during the interval $t_2-t_3$ when Set1Dump2 transitions from a high state to a low state and outputs DATA2 when Set2Dump1 goes high again during this interval. Therefore, according to the input data sequence shown in FIG. 3, latch 12, will be enabled to input DATA1, DATA3, DATA5, etc. and will be disabled when DATA2, DATA4, DATA6, etc. are provided to the input terminal 8, i.e., during the intervals when the Set2Dump1 control line transitions from high to low and from low to high respectively. Similarly, latch 10 will be enabled to input DATA2, DATA4, DATA6, etc. and will be disabled when DATA1, DATA3, DATA5, etc. are provided to the input terminal 8, i.e., during the intervals when the Set1Dump2 control line transitions from high to low and low to high respectively. Likewise, driver 14 will pass through DATA2, DATA4, DATA6, etc. to output terminal 22 when the Set2Dump1 control line is high and driver 16 will pass through DATA1, DATA3, DATA5, etc. to output 22 when the Set1Dump2 control line is high.

Figure 4:
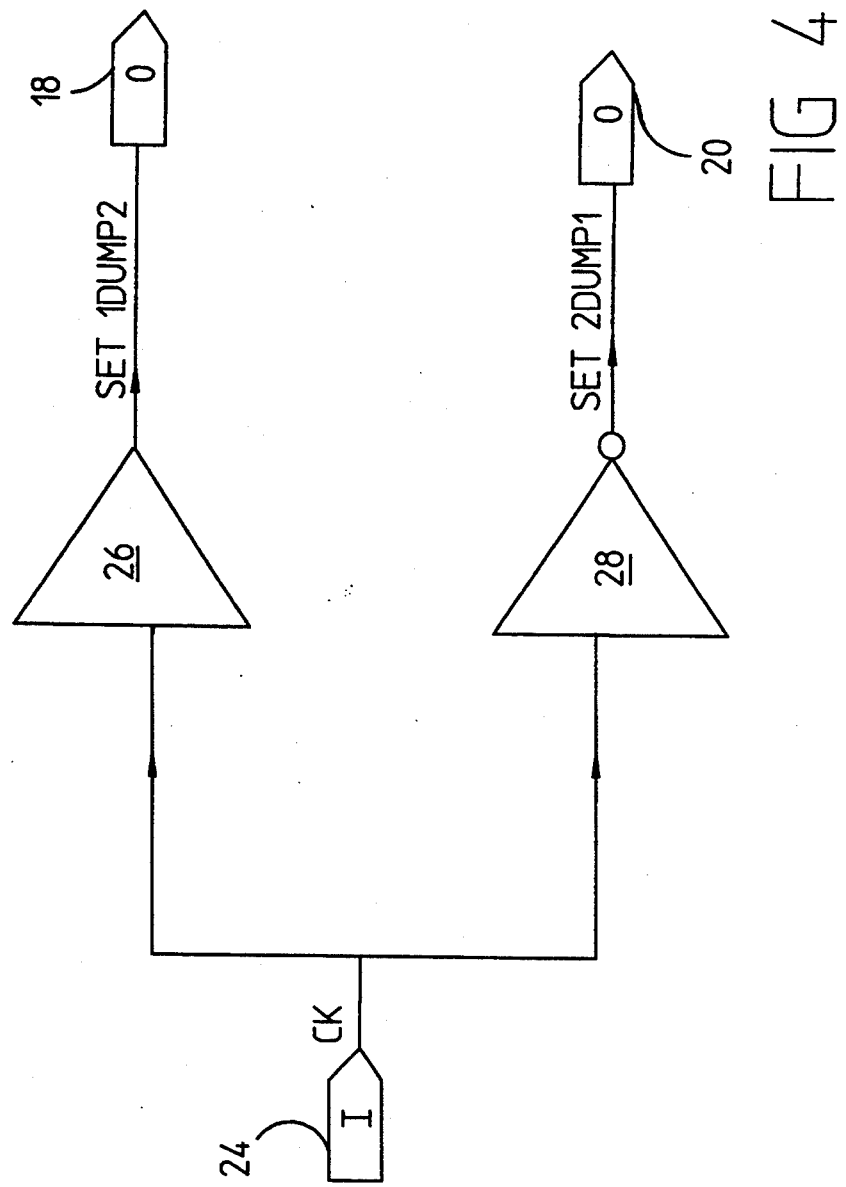
FIG. 4 is a circuit diagram of a clock generator according to the present invention used in long hold time applications.

A clock generator for controlling the timing of the control lines 18 and 20 according to the timing diagram shown in FIG. 3 is depicted in FIG. 4. The master clock signal is input to the clock generator at input 24. On each positive phase of the master clock signal (i.e., the master clock signal is in a high state), buffer 26 passes through the clock signal causing the Set1Dump2 control line 18 to go high and inverter 28 inverts the clock signal causing the Set2Dump1 control line 20 to go low. On each negative phase of the master clock signal (i.e., the master clock signal is in a low state), buffer 26 passes through the clock signal causing the Set1Dump2 control line 18 to go low and inverter 28 inverts the clock signal causing the Set2Dump1 control line 20 to go high.

The simple clock generator of FIG. 4 may, however, need modification. For instance, where the input data will hold only for a short time relative to the master clock's trailing edge, some of the data could be lost or overwritten as the control lines change states. This situation is shown in the timing diagram of FIG. 5. Since the Set2Dump1 and Set1Dump2 control lines have overlapping timing, i.e. one control line is transitioning to a high state while the other control line is transitioning to a low state, the input data could reach the output terminal 22 rather than being stored in the appropriate latch.

For example, DATA2 will be present at the input to latch 12 as the Set2Dump1 control line transitions to a low state. At about the same time Set1Dump2 transitions to a high state thereby enabling driver 16. Therefore, DATA2 may be passed through latch 12 and driver 16 to the output terminal 22 almost immediately (there will be some gate delays) after it was received at the input to latch 12. In such a case, the dual transparent latch of FIG. 2 would function more like a data buffer—simply passing through the data rather than properly storing it until the next phase of the master clock signal. It is necessary to hold the input data during the phase transition of the clock signal when the dual transparent latch is used to speed up a circuit such as the iterative loop shown in FIG. 1 because if the data is passed almost immediately through the dual latch the data operation blocks 5 and 6 will receive and operate on this data before the next data from DATAIN1 and DATAIN2 is received at the inputs of data operation blocks 5 and 6 respectively. In such a case, data can be lost.

Another problem could arise if the clock generator of FIG. 4 was used when the input data is held only for a short time. During the time interval $t_1$–$t_2$, DATA2 is provided as an input to the circuit at input terminal 8. At the same time Set1Dump2 is transitioning to a high state, DATA2 is received at the input to latch 10. Simultaneously Set2Dump1 is transitioning to a low state, but has not yet reached the low state. It is, therefore, possible that driver 14 is still enabled while latch 10 is latching in the data at its input so that DATA2 is passed through latch 10 and driver 14 to the output terminal 22 while DATA1 is also being passed to the output terminal 22 through driver 16. In such a case, DATA2 could overwrite DATA1.

Figure 6:
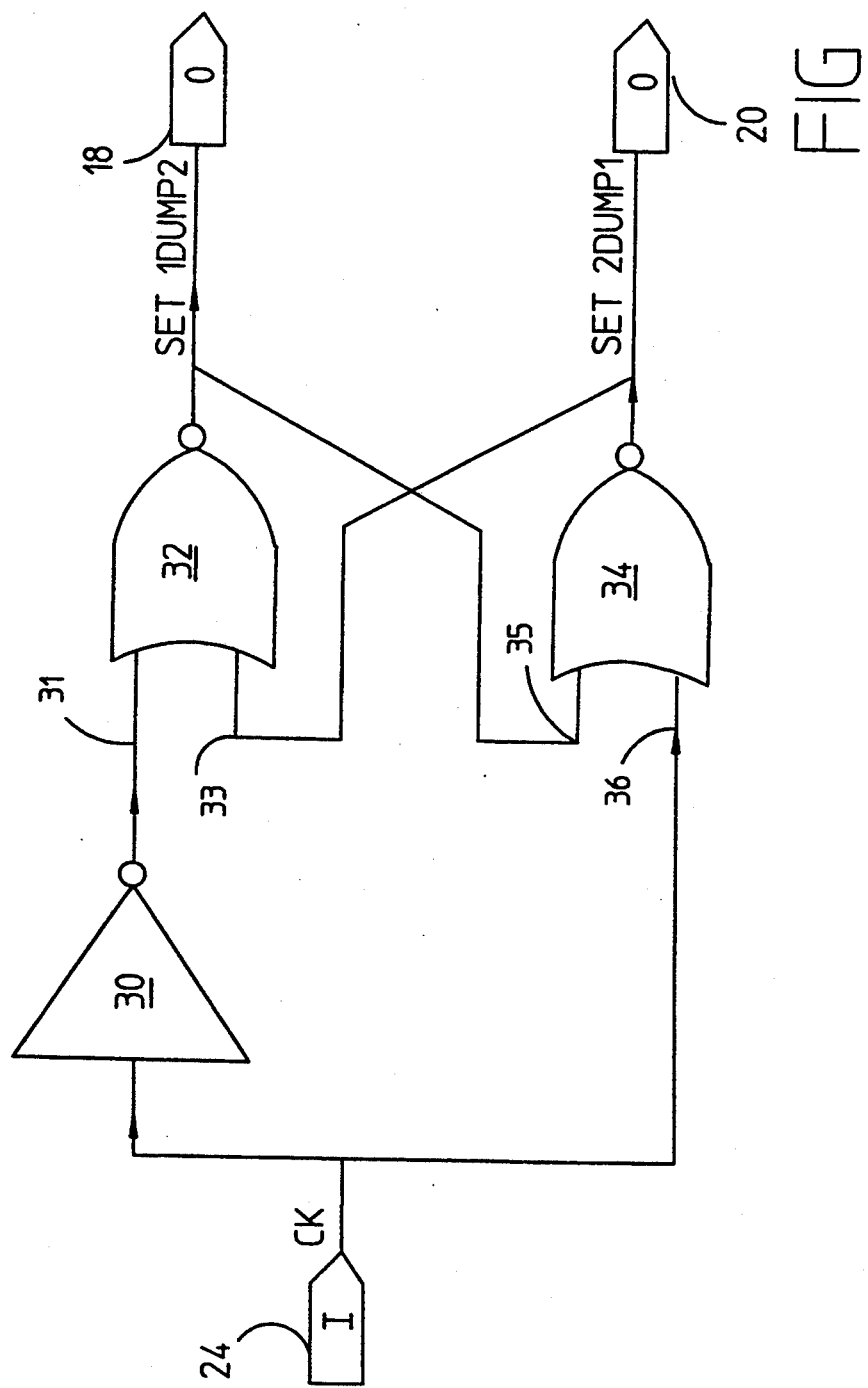
FIG. 6 is a circuit diagram of a clock generator according to the present invention preferably used in short hold time applications.

These problems can be avoided by allowing the control line transitioning to a low state to reach the low state before permitting the other control line to transition to a high state. A clock generator circuit for providing this control is shown in FIG. 6. Two NOR gates 32 and 34 are shown. Each gate has an input based on the master clock signal and a second input based on the output of the other gate. The output of a NOR gate is high only when both of the inputs to the gate are low. Therefore, one control line cannot transition to a high state until the other control line has substantially transitioned to a low state.

The master clock signal is input to the clock generator at input terminal 24. When the master clock signal state is high, inverter 30 causes the input 31 to NOR gate 32 to go low. The output of the NOR gate 32 will therefore only go low after the Set2Dump1 control line 20 also goes low since the Set2Dump1 control line 20 provides the second input to NOR gate 32 at input 33. When the master clock signal is low, the first input to NOR gate 34 is correspondingly low. The output of NOR gate 34 will not go high until the Set1Dump2 control line 18 goes low to provide the second input to NOR gate 34 at input 35.

Figure 7:
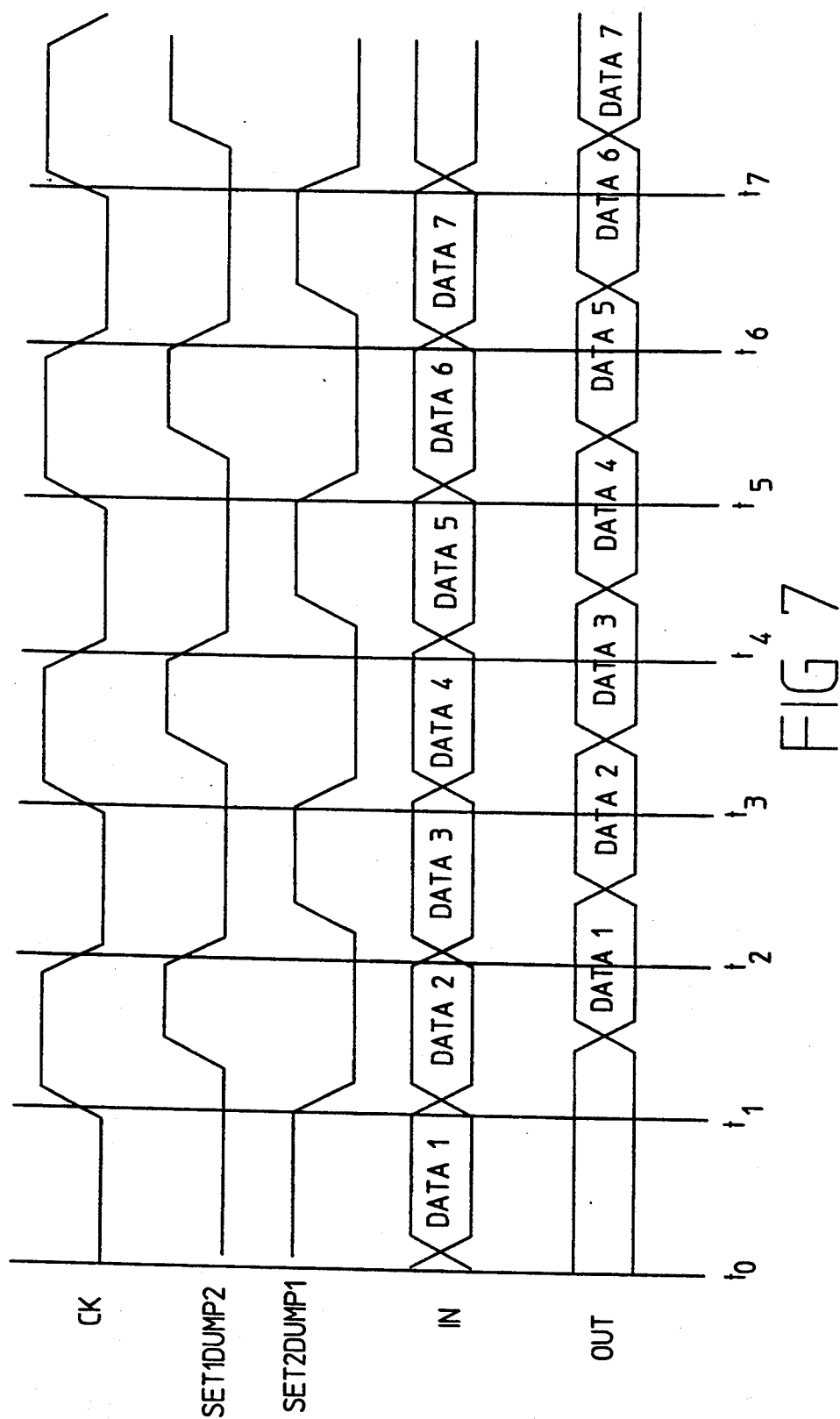
FIG. 7 is a timing diagram showing the timing of the dual transparent latch according to the present invention using the clock generator of FIG. 6.

The timing diagram for the clock generator of FIG. 6 is shown in FIG. 7. During the interval $t_1$–$t_2$, the Set2Dump1 control line reaches a low state before the Set1Dump2 control line transitions to a high state. Thus, driver 14 is disabled by the Set2Dump1 control line before DATA2 is input to latch 10 eliminating any possibility that DATA2 could be passed through to the output terminal 22 at the same time DATA1 reaches the output terminal 22. Similarly, during the interval $t_2$–$t_3$ the Set1Dump2 control line transitions to a low state before the Set2Dump1 control line begins to transition to a high state. Therefore, driver 16 is disabled before DATA3 is input to latch 12 so that DATA3 cannot be output from driver 16 during the same interval that DATA2 is output from driver 14.

Additionally, the use of NOR gates provide a much shorter fall time (i.e., time to transition from a high state to a low state) than the fall time of the master clock signal as shown in FIG. 7. This characteristic is advantageous for at least two reasons. The first being that the time period critical to the data race, e.g., latch 12 latching in DATA2 at $t_1$ rather than DATA1, is decreased so that the possibility of losing data is lessened. This phenomenon is better explained by reference to FIG. 7. DATA1, according to the timing diagram of FIG. 7, is received at input terminal 8 during the time interval $t_0$–$t_1$. When the Set2Dump1 control line transitions to a low state at $t_1$, DATA1 is latched into latch 12. However, if the transition from a high state to a low state was longer (e.g., as shown in the timing diagram of FIG. 5), it would be possible for DATA2 to be input to latch 12 since DATA2 would arrive at input terminal 8 before the Set2Dump1 control transitioned to a substantially low state. Therefore, use of the clock generator of FIG. 6 decreases the possibility that the dual transparent latch will act as a data buffer.

Furthermore, the rise time, i.e., the transition from a low state to a high state, of the control signals can be maintained as a longer transition time using the NOR gates. Therefore, the hold time is increased even further.

Figure 5:
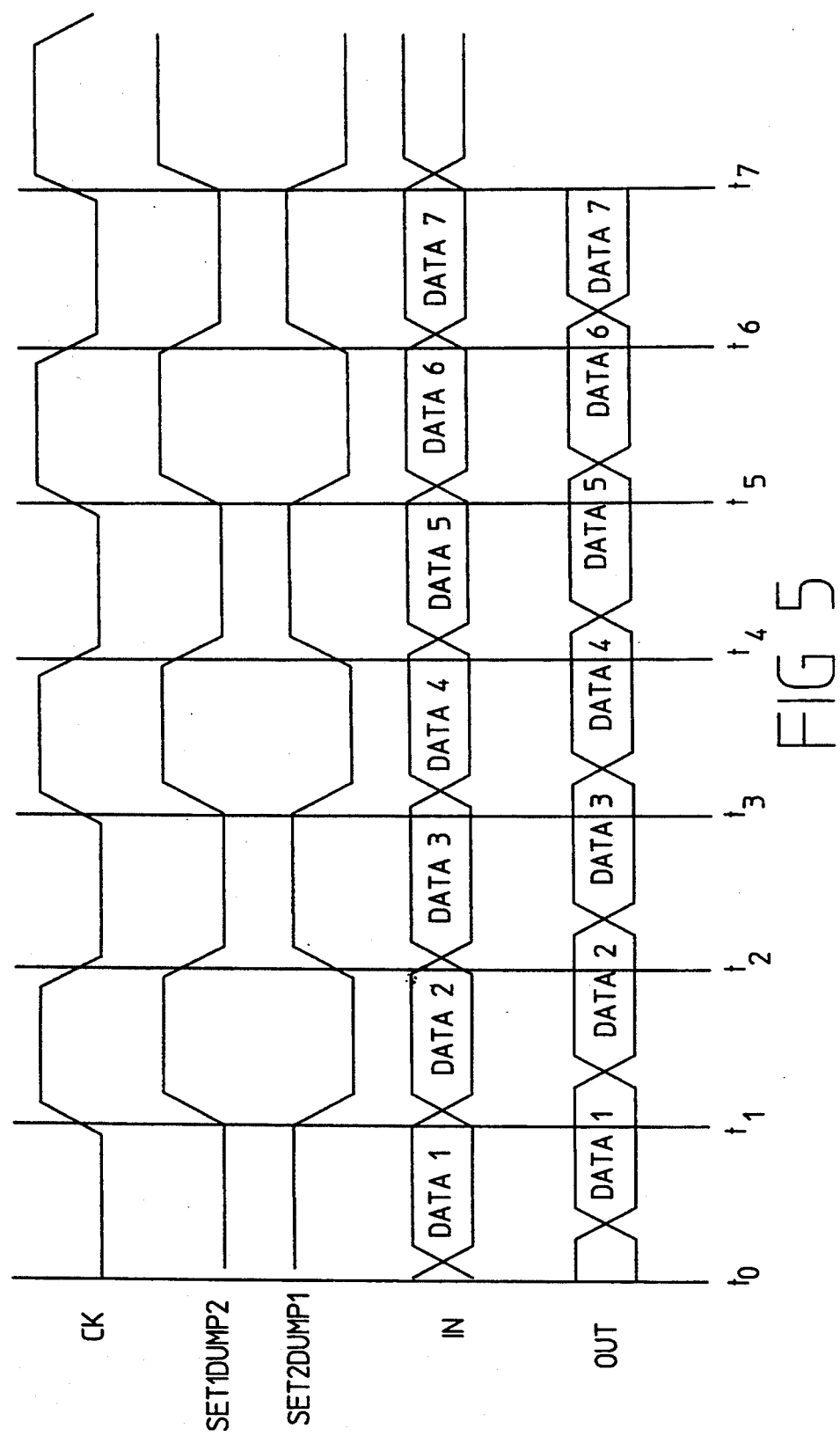
FIG. 5 is a timing diagram showing the effects of hold time violations using the clock generator of FIG. 4.
Figure 8:
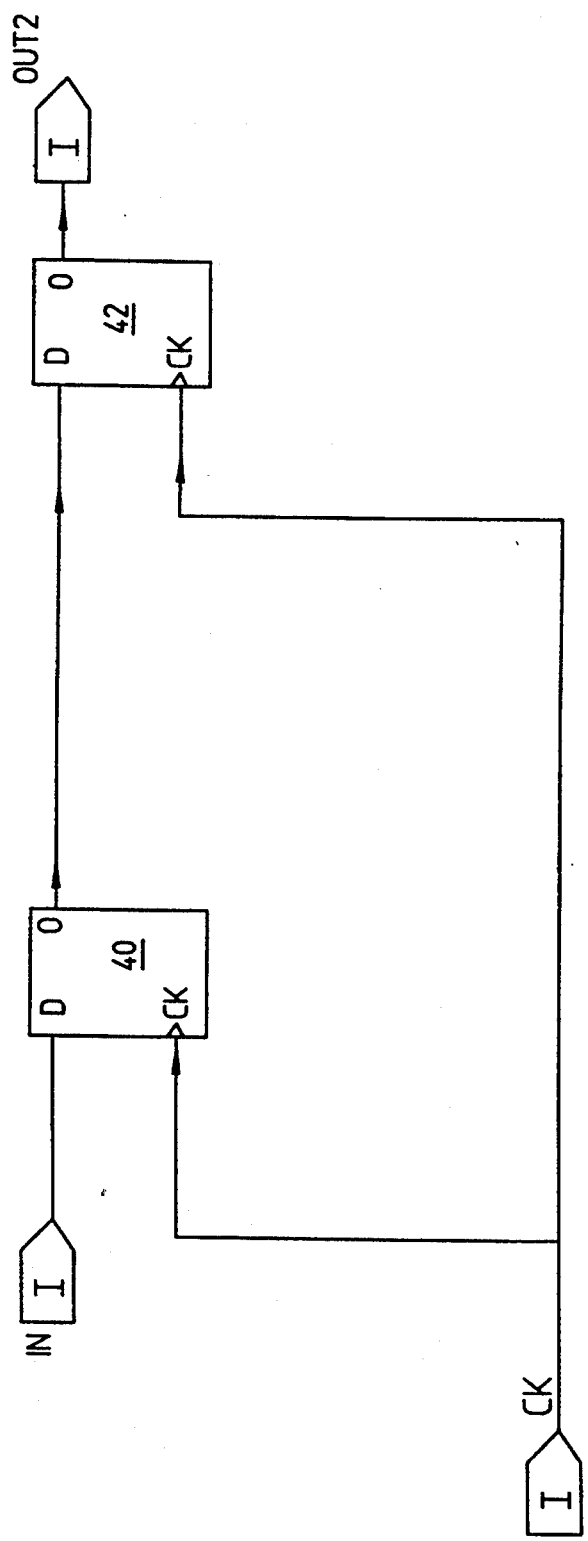
FIG. 8 is an example of one implementation of the present invention in a short hold time application.

The non-overlapping clock generator shown in FIG. 6 is preferably used whenever the dual transparent latch of the present invention will be interfaced with other circuitry to yield the timing of FIG. 7 such that the short hold time situation shown in the timing diagram of FIG. 5 will not occur. For instance where two latches are interfaced together as shown in FIG. 8, the output of latch 40 will be available as an input to latch 42 almost immediately after each clock pulse. Therefore, if latch 42 was the dual transparent latch of the present invention, the clock generator of FIG. 6 is preferably used to avoid losing or overwriting data while the control lines transition from one state to the next.

Figure 9:
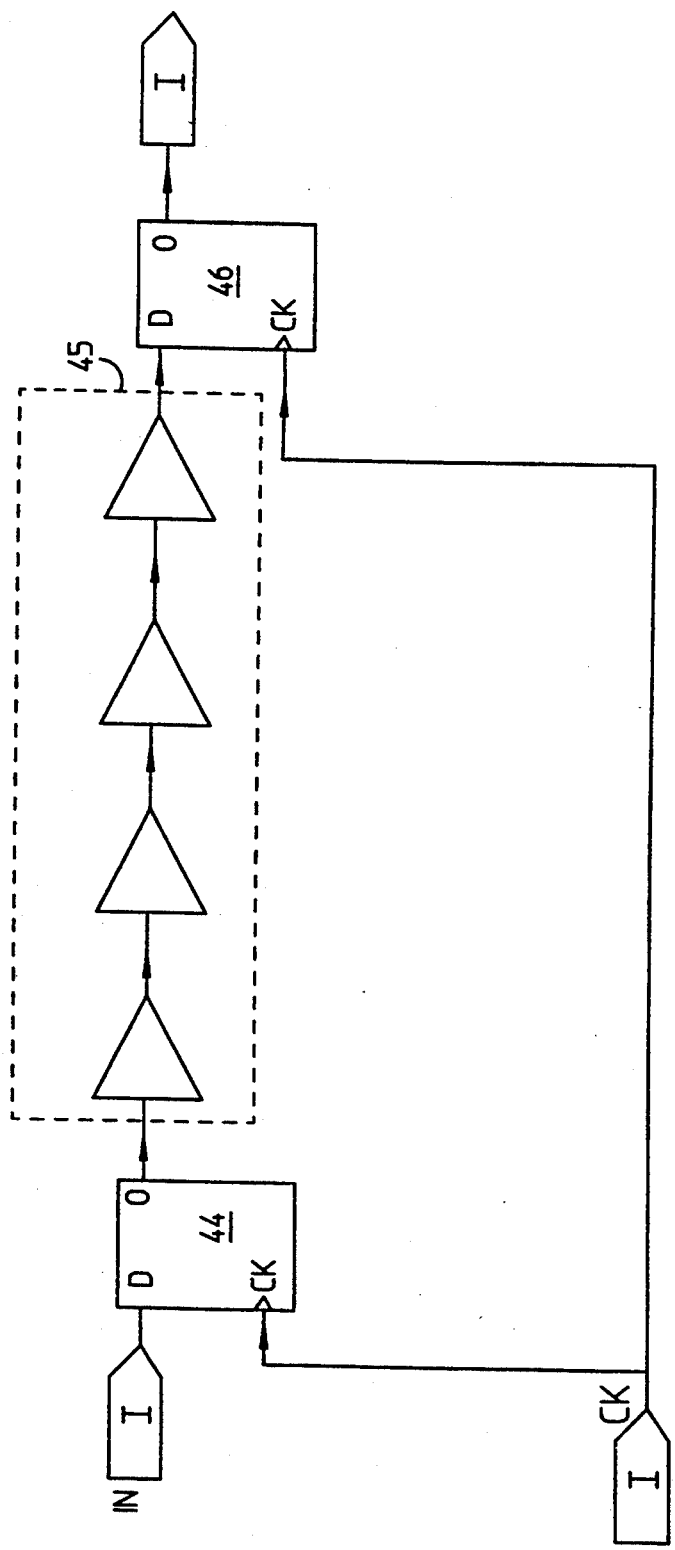
FIG. 9 is an example of one implementation of the present invention in a long hold time application.

However, the clock generator shown in FIG. 4 is preferably used whenever the dual transparent latch will be coupled to intervening circuitry as shown in FIG. 9. The data path from latch 44 to latch 46 is interrupted by several gates 45. Thus, after each clock pulse, latch 44 outputs its data to latch 46, but latch 46 does not receive this data for several gate delays after the clock pulse. Therefore, a long hold time situation shown by the timing diagram of FIG. 3 can be expected and the simpler clock generator of FIG. 4 may be used.

An alternative preferred embodiment of the dual transparent latch is shown in FIG. 10. Transistors 48 and 50 serve as inputs to the dual transparent latch where each transistor functions as a switch, i.e., when transistor 48 is turned on, data passes to inverter circuit 56, and when transistor 50 turns on, data passes to inverter circuit 58. When either transistor is turned off, no data can pass through to the respective inverter circuit. Transistors 52 and 54 serve as outputs to the dual transparent latch and likewise perform a switching function. Inverter circuit 56 holds the data until transistor 52 is switched on. Similarly, inverter circuit 58 holds data until transistor 54 is switched on. Thus, each inverter circuit 56 and 58 serves as a memory storing data and subsequently passing it through to output terminal 22 via transistors 52 and 54 respectively.

The transistors 48, 50, 52, and 54 may be switched on and off by the control lines 18 and 20, output from either clock generator shown in FIG. 4 or FIG. 6 depending on the hold time requirements, where control line 18 is shown as $\phi 1$ in FIG. 10 and control line 20 is shown as $\phi 2$ in FIG. 10. Therefore, transistors 48 and 54 are switched on and off at approximately the same time during one phase of the master clock signal and transistors 50 and 52 are switched on and off at approximately the same time during the other phase of the master clock signal.

It should be readily understood that many circuits could perform substantially the same as the circuit shown in FIG. 10 and, therefore, the invention should not be limited thereto. For instance, each inverter in FIG. 10 could be replaced by a buffer and each transistor replaced by any circuit capable of performing a switching function.

Figure 11A:
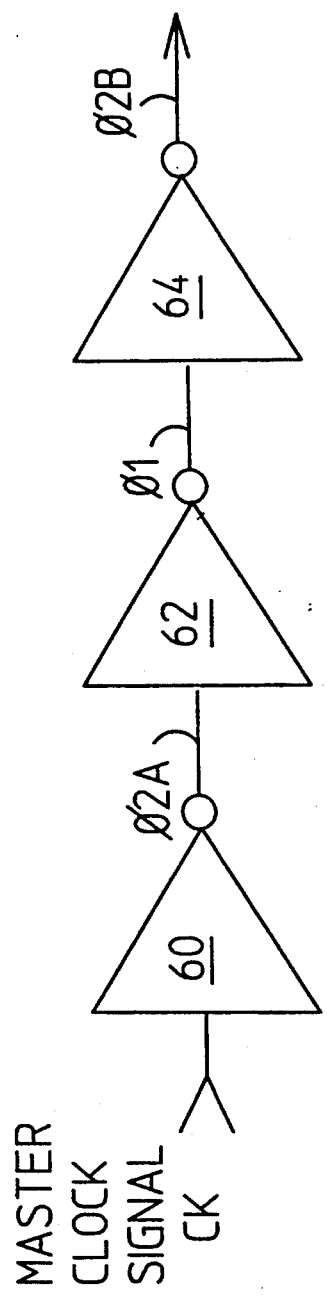
FIG. 11A is an alternative circuit diagram of a clock generator according to the present invention used in short hold time applications.
Figure 12:
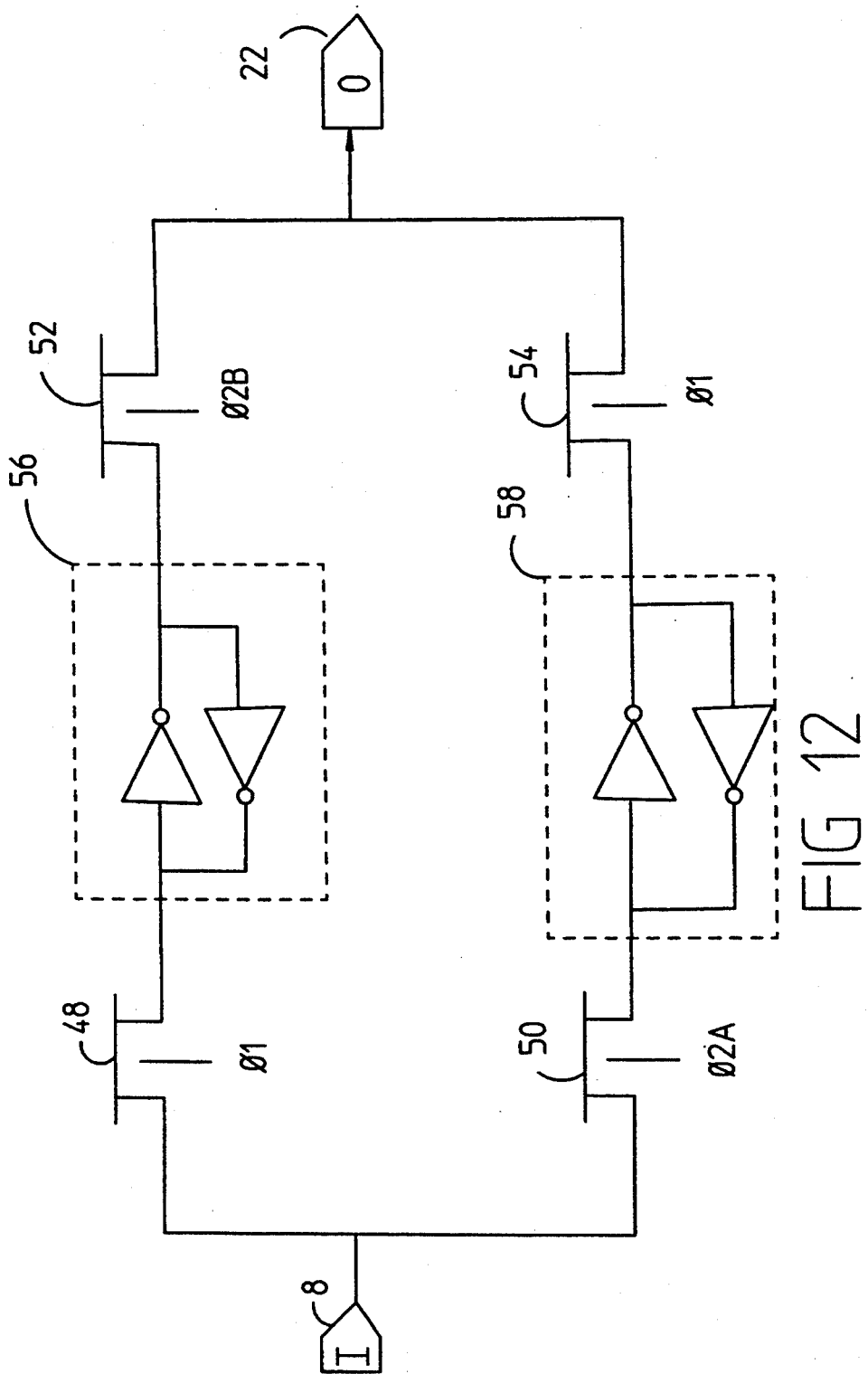
FIG. 12 shows one way to interface the circuit of FIG. 10 with the timing signals of FIG. 11B.

A second embodiment of a clock generator which is preferably used for short hold time applications is shown in FIG. 11A. A tree of inverters 60, 62, and 64 are used to generate three timing signals $\phi 2A$, $\phi 1$, and $\phi 2B$, respectively. Each timing signal is used to turn on one or more of the transistors 48, 50, 52, and 54 as shown in FIG. 12. FIG. 11B is a timing diagram showing the timing of the signals generated by the clock generator shown in FIG. 11A. By reference to FIGS. 11B and 12, it is readily apparent that the timing signals $\phi 2B$ and $\phi 1$ provided to transistors 52 and 54, respectively are delayed by inverters 64 and 62 so that neither transistor will turn on before the corresponding transistors 48 and 50, respectively, turn off. This timing eliminates the problem discussed above of overwriting data in short hold time applications. Furthermore, timing signal $\phi 1$ is delayed with respect to timing signal $\phi 2A$ by one gate delay resulting from inverter 62. Therefore, transistor 48 is not switched on until after transistor 50 is switched off thereby reducing the possibility of losing data as described above. It should be understood that only two inverters are required, if the master clock signal is used directly as the timing signal $\phi 2A$.

Figure 13:
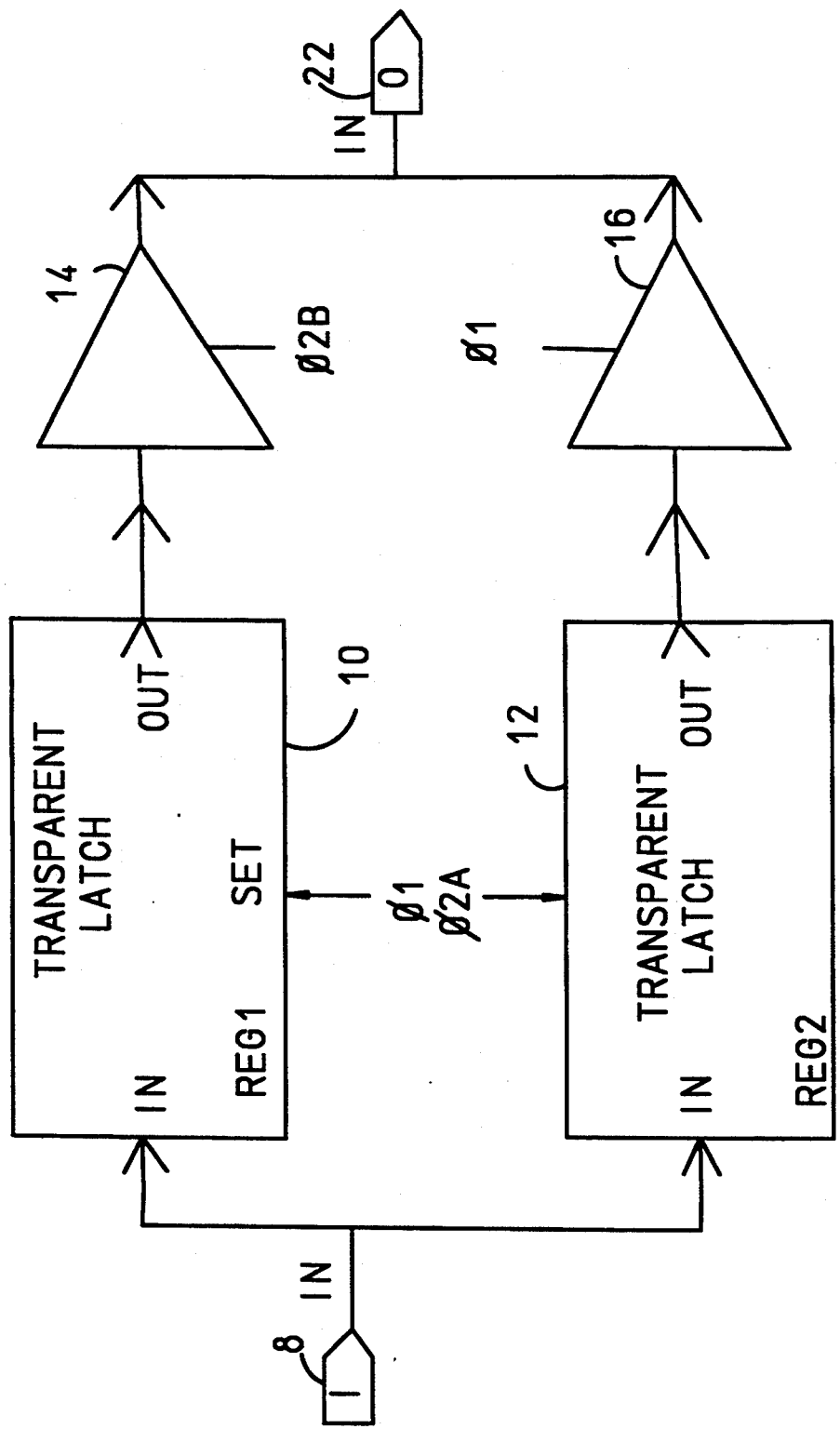
FIG. 13 shows one way to interface the timing signals of FIG. 11B with a modified circuit of FIG. 2.

Additionally, it should also be understood that each combination of an input transistor, i.e., transistors 48 and 50, with an inverter circuit, inverter circuits 56 and 58, respectively, performs functionally the same as latch 10 or 12 in FIG. 2. Furthermore, transistors 52 and 54 provide the same function as the tri-state drivers 14 and 16 in FIG. 2. Therefore, referring to FIG. 13, a circuit diagram of the dual transparent latch shown in FIG. 2 is shown except that the control lines Set1Dump2 and Set2Dump1 have been replaced with inputs generated by the clock generator of FIG. 11A.

A method for transferring data at a higher frequency than the frequency of a master clock is also provided according to the present invention. First, a master clock signal having a master frequency is generated. The data inputs to memory and outputs therefrom are selectively enabled at an input data rate greater than the master frequency, so that data is input and output at that rate. The method of the present invention, preferably enables only one of the inputs and only one of the outputs at any one instant of time.

Preferably the input data rate is twice the master frequency such that data is input to and output from memory each time the master clock signal changes from a high state to a low state and vice versa.

While the invention has been described and illustrated with reference to specific embodiments, those skilled in the art will recognize that modification and variations may be made without departing from the principles of the invention as described hereinabove and set forth in the following claims.

We claim:

1. A circuit operably controlled by a master clock signal having a high state and a low state alternating at a master frequency, comprising:

a memory means for storing data, the memory means having at least two inputs for receiving data and at least two corresponding outputs for providing an output of the data stored therein; and a control means coupled to the memory means for selectively enabling the inputs of the memory means at different instants of time during a period of the master clock signal to collectively receive and store data at a higher frequency than the master frequency and for selectively enabling the outputs of the memory means at different instants of time during the period of the master clock signal to collectively output the data stored therein at the higher frequency.

2. The circuit of claim 1, wherein the memory means further comprises:

a first and a second latch for storing the data, each latch having an input for receiving the data and an output for outputting the data stored therein; and a first driver and second driver, each driver having an input and an output, the input of the first driver being coupled to the output of the first latch and the input of the second driver being coupled to the output of the second latch.

3. The circuit of claim 2, wherein the control means further comprises:

a first and second control line, each control line cross coupling one latch and one driver, the first control line being operable to enable the input of the second latch to receive and store the data and to enable the first driver to provide an output of the data stored by the first latch, the second control line being operable to enable the input of the first latch to receive and store data and to enable the second driver to provide an output of the data stored by the second latch; and a clock generator having an input for receiving the master clock signal and for switching a state of the control lines between a high state and a low state based upon the state of the master clock signal, the state of each control line determining whether the input of the latch and driver coupled thereto are operably enabled, the states of the first control line and second control line being switched substantially opposite one another.

4. The circuit of claim 3, wherein the first control line is switched to a substantially high state only after the second control line is switched to a substantially low state and the second control line is switched to a substantially high state only after the first control line is switched to a substantially low state.

5. The circuit of claim 1, wherein one input of the memory means and one output thereof are enabled each time the master clock signal alternates from one state to the other.

6. The circuit of claim 1, wherein the higher frequency is approximately twice the master frequency.

7. The circuit of claim 1, wherein the control means enables only one of the inputs to receive and store data in the memory means at any one instant of time and enables only one of the outputs to output the data stored therein at any one instant of time.

8. The circuit of claim 1, wherein the control means selectively enables the inputs and corresponding outputs so that no one of the inputs and its corresponding output are enabled at substantially the same instant of time.

9. The circuit of claim 1, wherein the inputs of the memory means are input switches and the outputs of the memory means are output switches, the control means providing at least two timing signals based on the master clock signal to turn on and off each switch so that each input switch is alternately turned on and off and each output switch is alternately turned on and off.

10. The circuit of claim 9, wherein the timing signals comprise:

a first timing signal switching on and off a first input switch and one output switch corresponding to a second input switch;

a second timing signal switching on and off the second input switch; and a third timing signal switching on and off the output switch corresponding to the first input switch.

11. The circuit of claim 10, wherein the control means further comprises:

a clock tree having at least a first and a second delay means, an input of the first delay means receiving the second timing signal, and an output thereof outputting the first timing signal, and an input of the second delay means receiving the first timing signal and an output thereof outputting the third timing signal.

12. A circuit operably controlled by a master clock signal having a high state and a low state alternating at a master frequency, comprising:

a memory network having at least two input terminals and at least two corresponding output terminals; and a timing control circuit coupled to the memory network, the timing control circuit selectively enabling the input terminals of the memory network at different instants of time during a period of the master clock signal and selectively enabling the output terminals at different instants of time during a period of the master clock signal so that the memory network is operable at a higher frequency than the master frequency.

13. The circuit of claim 12, wherein the memory network further comprises:

a first and a second latch storing the data, each latch having an input receiving the data and an output outputting the data stored therein; and a first driver and second driver, each driver having an input and an output, the input of the first driver being coupled to the output of the first latch and the input of the second driver being coupled to the output of the second latch.

14. The circuit of claim 13, wherein the timing control circuit further comprises:

a first and second control line, each control line cross coupling one latch and one driver, the first control line being operable to enable the input of the second latch to receive the data and to enable the first driver to provide an output of the data stored by the first latch, the second control line being operable to enable the input of the first latch to receive data and to enable the second driver to provide an output of the data stored by the second latch; and a clock generator having an input receiving the master clock signal and switching a state of the control lines between a high state and a low state based upon the state of the master clock signal, the state of each control line determining whether the input of the latch and driver coupled thereto are operably enabled, the states of the first control line and second control line being switched substantially opposite one another.

15. The circuit of claim 14, wherein the first control line is switched to a substantially high state only after the second control line is switched to a substantially low state and the second control line is switched to a substantially high state only after the first control line is switched to a substantially low state.

16. The circuit of claim 12, wherein one input terminal of the memory network and one output terminal thereof are enabled each time the master clock signal alternates from one state to the other.

17. The circuit of claim 12, wherein the higher frequency is approximately twice the master frequency.

18. The circuit of claim 12, wherein the timing control circuit enables only one of the input terminals to receive and store data at any one instant of time and enables only one of the output terminals to output the data stored therein at any one instant of time.

19. The circuit of claim 12, wherein the timing control circuit selectively enables the input terminals and the corresponding output terminals so that no one of the input terminals and its corresponding output terminal are enabled at the same instant of time.

20. The circuit of claim 12, wherein the input terminals of the memory network are input switches and the output terminals of the memory network are output switches, the timing control circuit providing at least two timing signals based on the master clock signal to turn on and off each switch so that each input switch is alternately turned on and off and each output switch is alternately turned on and off.

21. The circuit of claim 20, wherein the timing signals comprise:
 a first timing signal switching on and off a first input switch and one output switch corresponding to a second input switch;
 a second timing signal switching on and off the second input switch; and
 a third timing signal switching on and off the output switch corresponding to the first input switch.

22. The circuit of claim 21, wherein the control means further comprises:
 a clock tree having at least a first and a second delay means, an input of the first delay means receiving the second timing signal and an output thereof outputting the first timing signal, and an input of the second delay means receiving the first timing signal and an output thereof outputting the third timing signal.

23. A method of increasing an output data rate of a digital logic circuit comprising the steps of:
 generating a master clock signal at a master frequency;
 selectively enabling, at different instants of time during a period of the master clock signal, an input of first and second data inputs into a memory coupled to said digital logic circuit at a combined input data rate greater than the master frequency; and
 selectively enabling, at different instants of time during a period of the master clock signal, an output of first and second data outputs from the memory at a combined rate substantially equal to the combined input data rate, said rate defining the output data rate.

24. The method of claim 23, wherein only one of the data inputs is enabled to receive and store data in memory at any one instant of time and only one of the outputs is enabled to output the data stored in memory at any one instant of time.

25. The method of claim 23, wherein the master clock signal has a high state and a low state alternating at the master frequency such that one input and one output are enabled each time the master clock signal alternates from one state to the other.

26. The method of claim 23, wherein the input data rate is approximately twice the master frequency.

* * * * *